United States Patent
Ma et al.

(10) Patent No.: US 10,735,027 B2
(45) Date of Patent: Aug. 4, 2020

(54) METHOD OF DETECTING AUDIO INPUT MODE

(71) Applicant: Unlimiter MFA Co., Ltd., Eden Island (SC)

(72) Inventors: Ming-Ren Ma, Taipei (TW); Kuo-Ping Yang, Taipei (TW); Neo Bob Chih-Yung Young, Taipei (TW); Kuan-Li Chao, Taipei (TW); Jian-Ying Li, Taipei (TW)

(73) Assignee: UNLIMITER MFA CO., LTD., Eden Island (SC)

( * ) Notice: Subject to any disclaimer, the term of this patent is extended or adjusted under 35 U.S.C. 154(b) by 0 days.

(21) Appl. No.: 15/925,862

(22) Filed: Mar. 20, 2018

(65) Prior Publication Data

US 2019/0132003 A1    May 2, 2019

(30) Foreign Application Priority Data

Nov. 1, 2017  (TW) .............................. 106137817 A

(51) Int. Cl.
*H03M 11/10*    (2006.01)
(52) U.S. Cl.
CPC .................................. *H03M 11/10* (2013.01)

(58) Field of Classification Search
CPC ...... H04M 11/10; H04M 11/04; H04M 11/06; H04M 11/08
See application file for complete search history.

(56) References Cited

U.S. PATENT DOCUMENTS

| | | | |
|---|---|---|---|
| 2011/0298618 A1* | 12/2011 | Stahl ................. | H04M 1/72519 340/573.1 |
| 2012/0297304 A1* | 11/2012 | Maxwell ........... | H04M 1/72569 715/728 |
| 2013/0101127 A1* | 4/2013 | Buchmann ........... | H04R 29/005 381/58 |
| 2013/0329868 A1* | 12/2013 | Midtun ................. | H04M 11/00 379/88.14 |
| 2017/0366891 A1* | 12/2017 | Yang ...................... | G06F 3/165 |

* cited by examiner

*Primary Examiner* — Tuan D Nguyen
(74) *Attorney, Agent, or Firm* — Bacon & Thomas, PLLC

(57) ABSTRACT

A method of detecting audio input mode applied to an electronic device is disclosed. According to how the user presses the start button of the electronic device, the audio input mode is determined to be a short-press mode or a long-press mode. The method of detecting an audio input mode includes: detecting if a pressing time of the start button is less than a threshold time; if so, determining that the audio input mode is the short-press mode; if not, detecting if an audio time of the receiving audio of the microphone exceeds an audio threshold time during the pressing time; if so, determining that the audio input mode is the long-press mode; if not, determining that the audio input mode is the short-press mode.

11 Claims, 6 Drawing Sheets

METHOD OF DETECTING AUDIO INPUT MODE

BACKGROUND OF THE INVENTION

1. Field of the Invention

The present invention relates to a method of detecting audio input mode, and particularly to a method of detecting audio input mode according to a user's operating habit.

2. Description of the Related. Art

In general, communication software, AI (artificial intelligence) software, or translation software has an audio input function that allows users to directly use dictation to input data to mobile phones, so users no longer need to spend a lot of time typing on a phone keypad or virtual keyboard to enter text.

The communication software or the translation software usually provides a long-press audio operation button on the software interface for audio input. The long-press type audio operation button is used for a user to press and hold down, and the user can also speak to the mobile phone while holding down the audio operation button. In this way, the mobile phone will record the audio received while the button is pressed, and the communication software, the AI software or the translation software will perform a cloud upload or convert the recorded audio to text. In addition, certain software provides a short-press audio operation button on the software interface. The short-press type audio operation button is used for a user to short press to enable the software to start the recording function for audio recording. After the user finishes recording audio, the user may press the short audio operation button again or the software automatically turns off the audio recording function, and the communication software or the translation software will perform a cloud upload or convert the recorded audio to text.

However, users are usually only accustomed to using one of the long-press or short-press modes of operation. Thus, when using different software, they often need to modify their own habits and reluctantly use different operating modes provided by different software.

Therefore, it is necessary to provide a method of detecting and adjusting audio input modes according to a user's operating habit.

SUMMARY OF THE INVENTION

It is a major objective of the present invention to provide a method of detecting audio input mode according to a user's operating habit.

To achieve the above objective, a method of detecting audio input mode is applied to an electronic device in the present invention, wherein the electronic device includes a microphone and a start button. The microphone is used to receive audio input. The start button is used for a user to press to enable an audio input mode to input voice, which is determined to be a short-press mode or a long-press mode according to how a user presses the start button. The method of detecting audio input mode includes: detecting if a pressing time of the start button is less than a threshold time, where the pressing threshold time is a duration within a range of 0.001 seconds to 1.5 seconds; if so, determining that the audio input mode is the short-press mode; if not, detecting if an audio time of receiving audio of the microphone exceeds an audio threshold time during the pressing time, where the audio threshold time is 0 seconds to 1.5 seconds; if so, determining that the audio input mode is the long-press mode; if not, determining that the audio input mode is the short-press mode.

According to an embodiment of the present invention, the pressing threshold time is a duration within the range of 0.001 seconds to 0.8 seconds.

According to an embodiment of the present invention, the audio threshold time is 0.2 seconds to 0.9 seconds.

According to an embodiment of the present invention, detecting the audio time is started when the user presses the start button.

According to an embodiment of the present invention, the electronic device is a mobile phone, a computer or a tablet computer.

According to an embodiment of the present invention, the electronic device further includes a speaker which is used to issue a prompt sound; a start time of detecting the audio time is after the speaker plays the prompt sound.

According to an embodiment of the present invention, the electronic device further includes a headset which is used to issue a prompt sound; a start time of detecting the audio time is after the headset plays the prompt sound.

According to an embodiment of the present invention, when the audio input mode is the long-press mode, an end time of user input audio is the time at which the user releases the start button; when the audio input mode is the short-press mode, the end time of user input audio is not the time at which the user releases the start button.

DETAILED DESCRIPTION OF THE PREFERRED EMBODIMENT

Hereafter, the technical content of the present invention will be better understood with reference to preferred embodiments.

Figure 1:
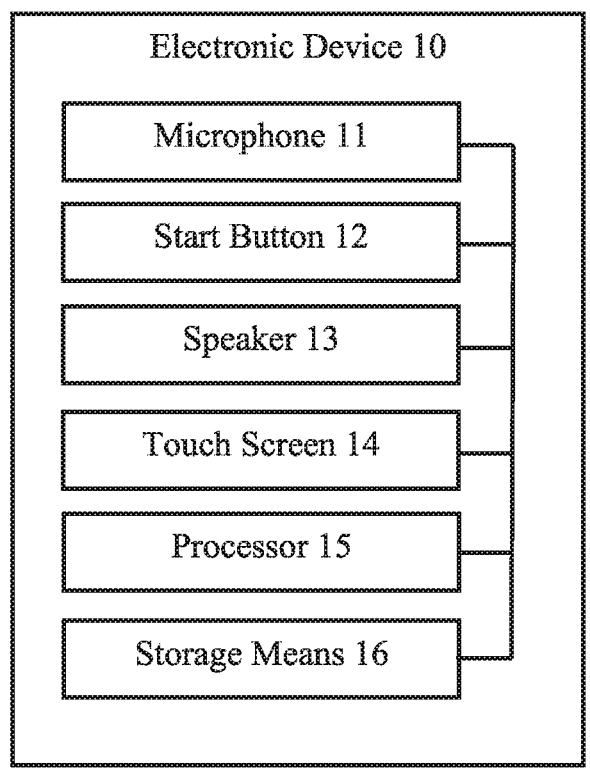
FIG. 1 is a system architecture diagram of an electronic device according a first embodiment of the present invention.
Figure 2:
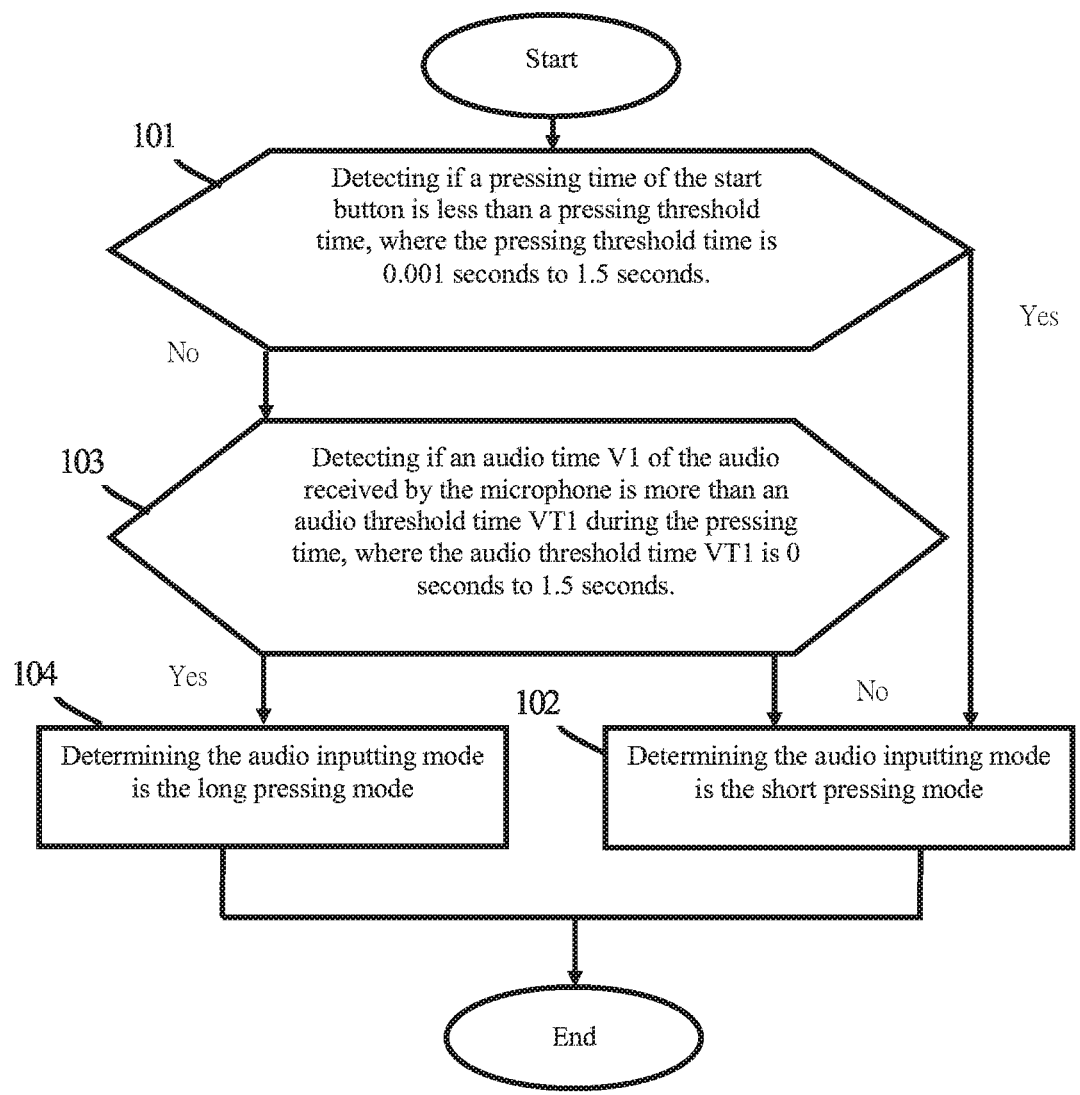
FIG. 2 is a flowchart showing steps in a method of detecting audio input mode according to the first embodiment of the present invention.
Figure 3:
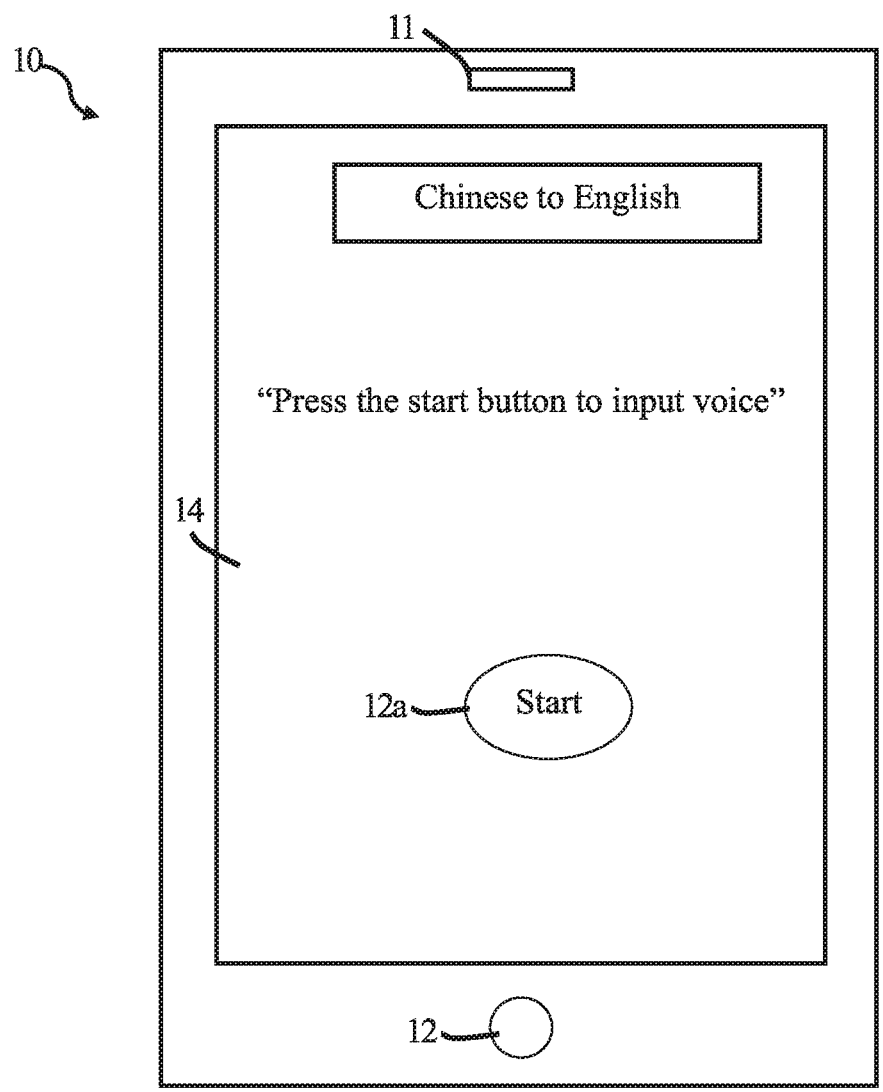
FIG. 3 is a schematic diagram of the electronic device according to the first embodiment of the present invention.

Hereafter, please refer to FIG. 1 to FIG. 3 regarding a method of detecting audio input mode according to a first embodiment of the present invention. FIG. 1 is a system architecture diagram of an electronic device according a first embodiment of the present invention; FIG. 2 is a flowchart showing steps in a method of detecting audio input mode according to the first embodiment of the present invention; and FIG. 3 is a schematic diagram of the electronic device according to the first embodiment of the present invention.

As shown in FIG. 1 to FIG. 3, in the first embodiment, the method of detecting audio input mode is programmed as a computer program and applied to an electronic device 10. The method of detecting audio input mode can automatically detect whether the user's voice input mode is a long-press mode or a short-press mode according to the user's operating habit. The electronic device 10, for example, may be a mobile phone, but may also be a computer or a tablet computer. The electronic device 10 includes a microphone 11, a start button 12, a speaker 13, a touch screen 14, a processor 15, and a storage means 16.

In the first embodiment of the present invention, the microphone 11 is used to receive a user's voice input. The touch screen 14 is used to display information for the user to view and manipulate. The processor 15, which is a Central Processing Unit (CPU), is electrically connected to the microphone 11, the start button 12, the speaker 13, the touch screen 14, and the storage means 16, for controlling the operation of these devices. The storage means 16 is a memory for storing the computer program programmed by the method of detecting audio input mode.

The start button 12 is a physical button that can be used by the user to press to start an audio input mode to input voice. Specifically, according to the difference of how the user presses the start button 12, the audio input mode is present as a short-press mode or a long-press mode. If the user long presses the start button 12, the audio input mode is the long-press mode. In the long-press mode, a start time at which the user inputs audio is the time at which the user presses the start button 12; an end time of user input audio is the time at which the user releases the start button 12. If the user short presses the start button 12, the audio input mode is the short-press mode. In short-press mode, a start time at which the user inputs audio is the time at which the user presses the start button 12; an end time of user input audio is not the time at which the user releases the start button 12. An end time of user input audio may be the time at which the user presses the start button 12 again or the time at which the user stops inputting audio after inputting audio for a short time. However, the start button 12 is not limited to a physical button. For example, the touch screen 14 may also display a virtual start button 12a (e.g., a smart phone usually has a start button 12a in a virtual form) for the user to press to start the audio input mode for audio input.

When the user executes a program that allows voice input (e.g., translation software, communication software, AI quiz software, and search software), the program programmed by the method of detecting audio input mode in the present invention can be designed to automatically start on the electronic device 10 or to be built into a program that allows audio input. In the present invention, the translation software in a computer program according to the method of detecting audio input mode is used as example, as shown in FIG. 3. When the user starts the translation software, the translation software provides a virtual start button 12a on the touch screen 14 according to the method of detecting audio input mode, and displays a message of "Press the start button to input voice" to inform the user to start audio input. Then the users can follow their own habits to press the start button 12 or a virtual start button 12a in a long-press or short-press manner, and the method of detecting audio input mode detects that the user wants to input voice through the long-press mode or the short-press mode according to the user's operating behavior of pressing the button and inputting the audio later. First, when the user presses the physical start button 12 or the virtual start button 12a, the method of detecting audio input mode will proceed to Step 101: Detecting if a pressing time of the start button is less than a pressing threshold time, where the pressing threshold time is a duration within a range of 0.001 seconds to 1.5 seconds.

When a user presses either of the start buttons 12, 12a, i.e., the physical start button 12 or the virtual start button 12a, the time at which the user presses one of the start buttons 12, 12a will be sent to the processor 15, and the time at which the user releases a start button 12, 12a will also be sent to the processor 15. The processor 15 will calculate the time difference between the pressing of the button and the releasing of the button, and the time difference is a pressing time P1 of a start button 12, 12a. The processor 15 will also detect whether the pressing time P1 is less than a pressing threshold value PT1; the pressing threshold time PT1 in the present invention is a specific duration within a range of 0.001 to 1.5 seconds, preferably within a range of 0.001 to 0.8 seconds. Through the actual observation and statistics of user's operating behavior, the average user short-press operation has been determined to be about 0.6 seconds, and the longest time of the pressing operation will not exceed 1.5 seconds, so the pressing threshold time PT1 is designed to range from 0.001 seconds to 1.5 seconds.

If the processor 15 detects that the pressing time P1 is less than a pressing threshold time PT1, the method proceeds to Step 102: Determining if the audio input mode is the short-press mode.

In the first embodiment, if the user presses the start button 12 for 0.6 seconds and then releases the start button 12, the processor 15 will calculate the pressing time P1 of the start button 12 to be 0.6 seconds, which is less than the 1.5 seconds of the pressing threshold time PT1; thus, the processor 15 will determine that the audio input mode to be used by the user is the short-press mode. Consequently, the processor 15 immediately adjusts the translation software and the start buttons 12, 12a to enable the translation software to start the recording function and record the audio to be input by the user, and the processor 15 also makes the start buttons 12, 12a ready to accept the user's second press to stop recording; or the processor 15 can also adjust the translation software and the start buttons 12, 12a such that the translation software starts the recording function, records the audio to be input by the user, and stops recording when the microphone 11 does receive the user's voice (that is, when the user no longer speaks).

If the processor 15 detects that the pressing time P1 is not less than a pressing threshold time PT1, the method proceeds to Step 103: Detecting if an audio time V1 of the audio received by the microphone exceeds an audio threshold time VT1 during the pressing time, where the audio threshold time VT1 is 0 seconds to 1.5 seconds.

Through the actual observation and statistics of user's operating behavior, it has been determined that in general, when a user performs a long-press to input voice, the user generally inputs the audio while pressing the start button 12, and the user usually inputs the audio for more than 1.5 seconds. Therefore, in order to determine whether the user wants to input voice using the long-press mode, the processor 15 enables the microphone 11 to receive the audio input when the user presses and holds the start button 12 during the pressing time P1. The microphone 11 sends the audio received in the pressing time P1 to the processor 15, which calculates the time length of an audio time V1 of the audio received by the microphone 11; the processor 15 also detects whether the audio time V1 exceeds an audio threshold time VT1, where the audio threshold time VT1 is 0 seconds to 1.5 seconds, preferably 0.2 seconds to 0.9 seconds. In addition, it should be noted that the starting point for the detection of the audio time V1 in the first embodiment is designed to start receiving audio during the pressing time P1, but the detection of the audio time V1 may also be designed to start as soon as the user presses the start button 12.

If the processor 15 detects that the audio time V1 of the audio received by the microphone 11 during the pressing time P1 exceeds an audio threshold time VT1, it can be determined that the audio input mode to be used by the user is indeed the long-press mode. Thus, the method continues to Step 104: Determining that the audio input mode is the long-press mode.

In the first embodiment, if the processor 15 determines that the audio time V1 exceeds an audio threshold time VT1, the processor 15 will then determine that the audio input mode to be used at the moment is the long-press mode. Thus, the processor 15 immediately adjusts the translation software and the start buttons 12, 12a such that the recording function records the audio input by the user pressing the pressing time P1 of a start button 12, 12a and allows the start buttons 12, 12a to stop recording when the user releases a start button 12, 12a.

After the method returns to Step 103, if the processor 15 detects that the audio time V1 of the audio received by the microphone 11 during the pressing time P1 does not exceed an audio threshold time VT1, it can be determined that the audio input mode to be used by the user is not the long-press mode. For example, some elderly people may not be good at operating the electronic device 10. After an elderly user long-presses the start button 12, such a user will only output brief audio to the microphone 11. Therefore, the pressing time P1 exceeds the pressing threshold time PT1, but the audio time V1 does not exceed the audio threshold time VT1. Accordingly, if this situation occurs, the method of the present invention will continue to Step 102: Determining that the audio input mode is the short-press mode.

If the processor 15 determines that the audio time V1 of the user audio received by the microphone 11 does not exceed the 1.5 seconds of an audio threshold time VT1 (e.g., the audio time V1 is merely 0.5 seconds), the processor 15 determines that the currently used audio input mode is the short-press mode. Consequently, the processor 15 instantly adjusts the translation software and the start buttons 12, 12a, enables the translation software to start the recording function, records the audio to be input by the user, and makes the start buttons 12, 12a ready to accept the user's press again to stop recording; or the processor 15 can also adjust the translation software and the start buttons 12, 12a such that the translation software starts the recording function, records the audio to be input by the user, and stops recording when the microphone 11 does not receive the user's voice (that is, when the user no longer speaks).

Figure 4:
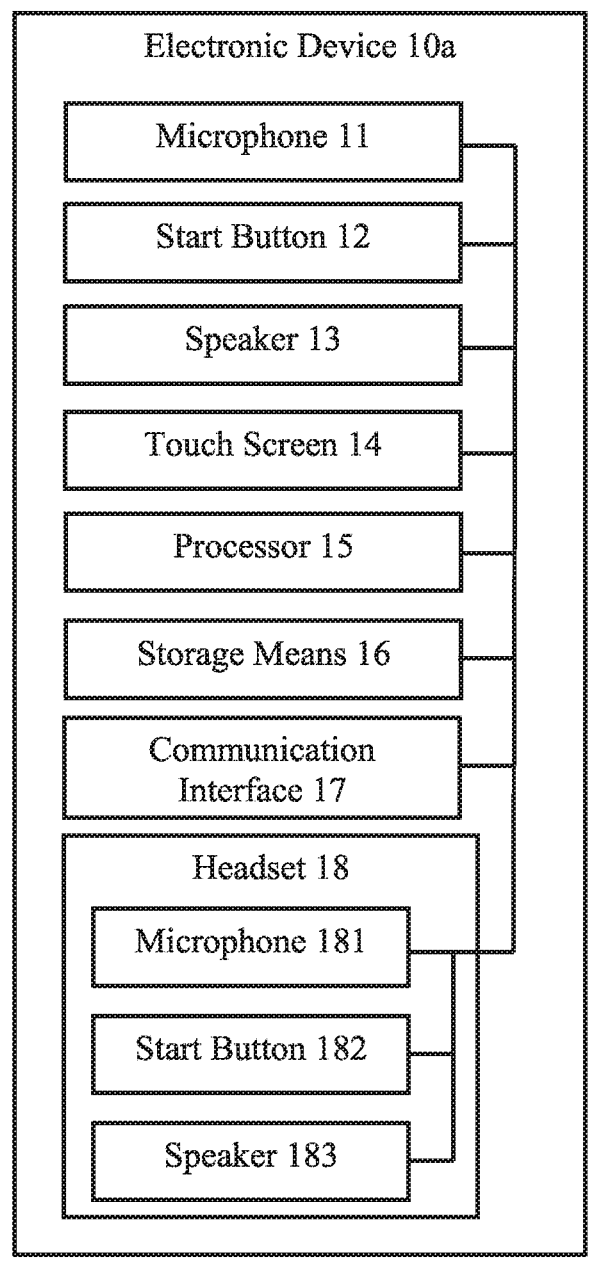
FIG. 4 is a system architecture diagram of an electronic device according a second embodiment of the present invention.
Figure 5:
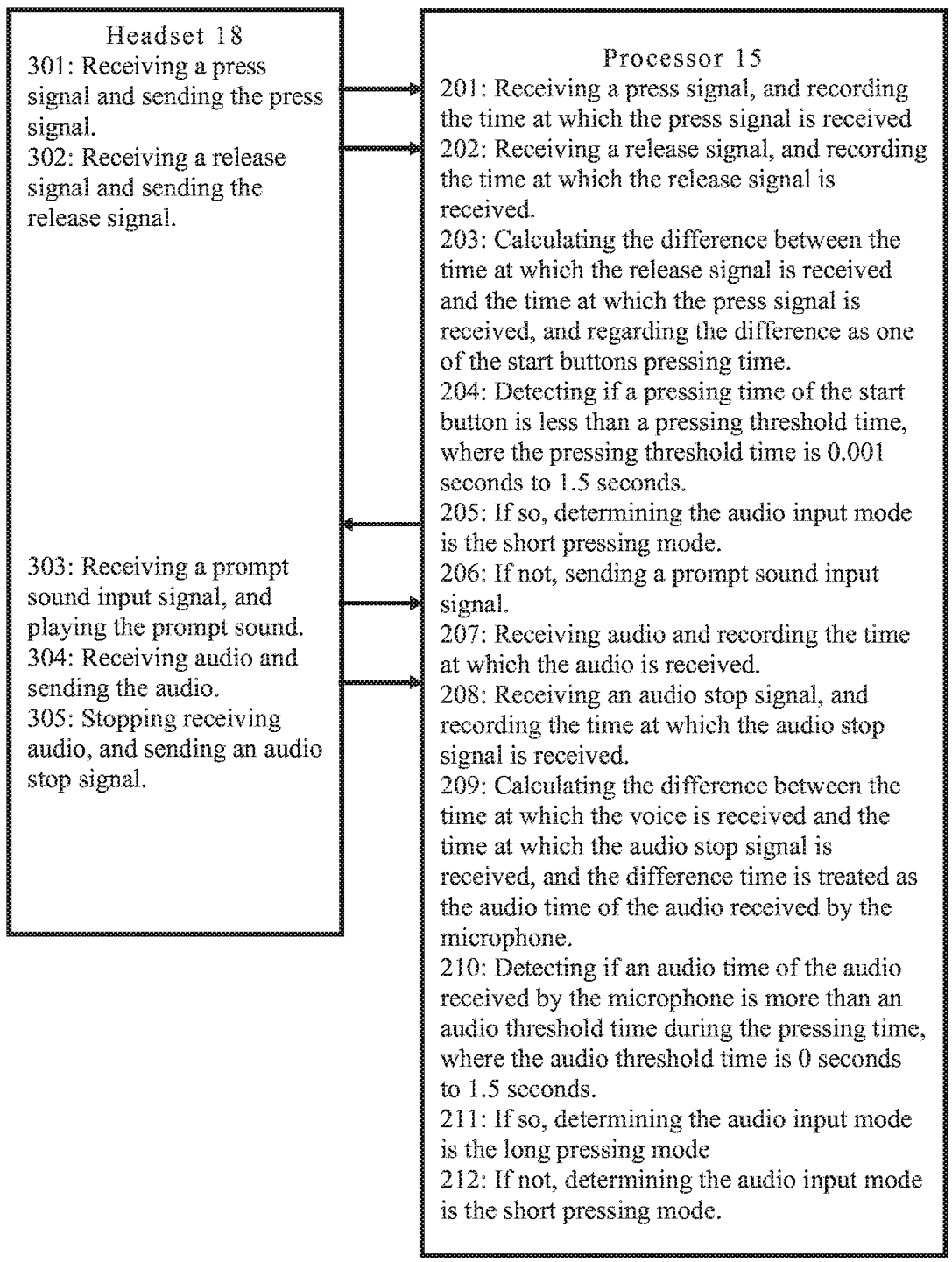
FIG. 5 is a flowchart showing steps in a method of detecting audio input mode using a headset according to the second embodiment of the present invention.
Figure 6:
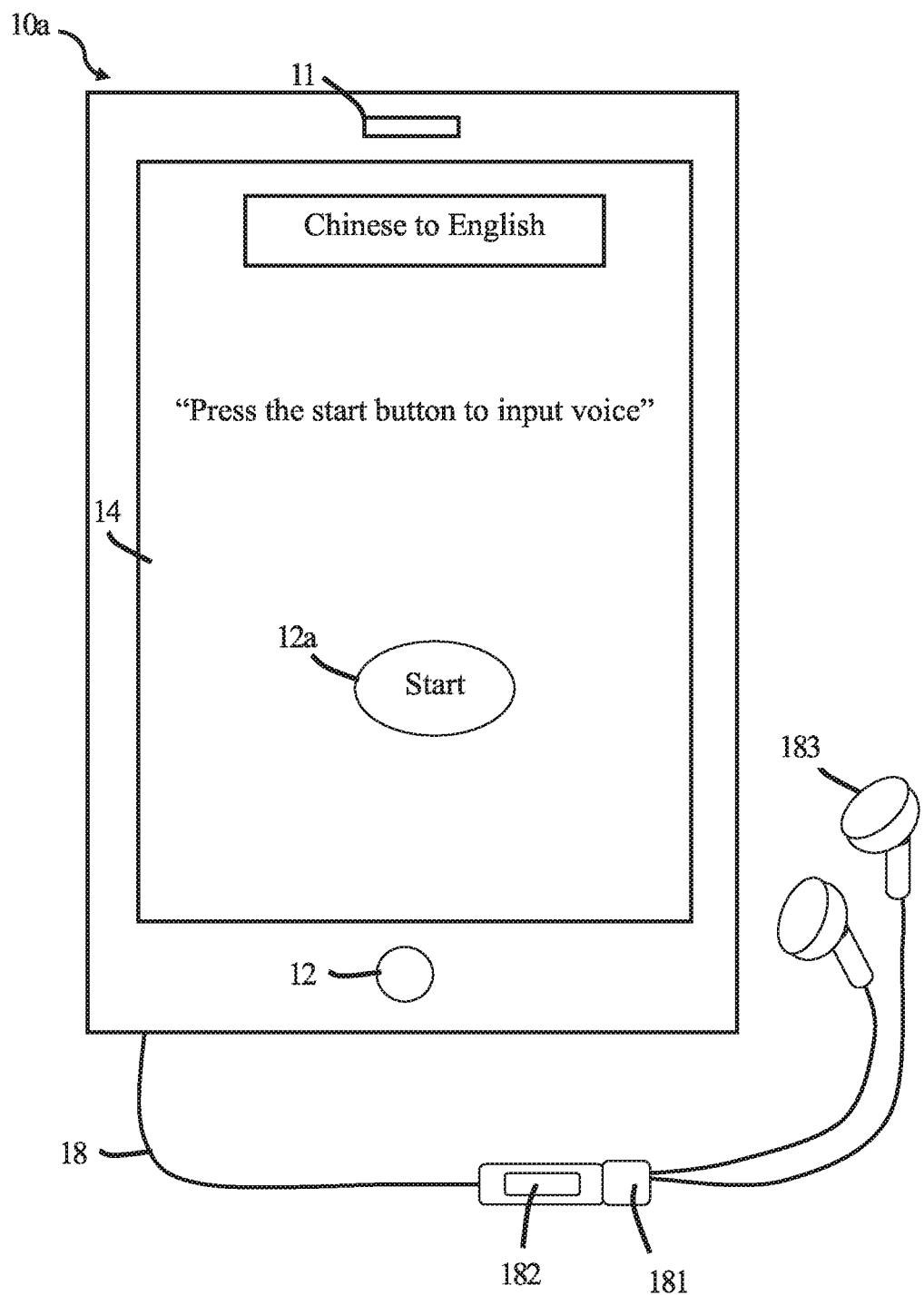
FIG. 6 is a schematic diagram of the electronic device according to the second embodiment of the present invention.

Hereafter, please refer to FIG. 4 to FIG. 6 together regarding a method of detecting audio input mode according to a second embodiment of the present invention. FIG. 4 is a system architecture diagram of an electronic device according to the second embodiment of the present invention; FIG. 5 is a flowchart showing steps of a method of detecting audio input mode with a headset according to the second embodiment of the present invention; and FIG. 6 is a schematic diagram of the electronic device according to the second embodiment of the present invention.

As shown in FIG. 4 to FIG. 6, in the second embodiment, the electronic device further includes a communication interface 17 and a headset 18. Both the communication interface 17 and the headset 18 are electrically connected to the processor 15. The communication interface 17 in the second embodiment, for example, may be a wireless module that can be electrically connected to other components by a wireless transmission function. The headset 18, for example, may be a wired multi-function headset that can emit sound and may include a microphone 181, a start button 182, and a speaker 183. The microphone 181 is used to receive audio, and the audio received by the microphone 181 can be sent to the processor 15. The start button 182 is used to receive the user's pressing operation, and the signal generated by the pressing operation received by the start button 182 can be transmitted to the processor 15. The speaker 183 is used for issuing a prompt sound to prompt the user to start audio input. In the second embodiment, the headset 18 is plugged into a headset jack (not shown) of the electronic device 10a so that the headset 18 and the microphone 181, the start button 182 and the speaker 183 are also electrically connected to the processor 15 through the headphone jack. Consequently, the components in the headset 18 can also be used in conjunction with the method of detecting audio input mode in the present invention. However, the headset 18 is not limited to a wired headset but can also be a wireless headset that can be electrically connected to the communication interface 17 to communicate with the processor 15.

In the second embodiment, if the user wants to use the headset 18 together with the translation software in the electronic device 10a, the user may first start the translation software, and then according to their own habits, press the start button 182 in a long-press or short-press manner. At this time, the headset will perform Step 301: Receiving a press signal and sending the press signal.

When the user presses the start button 182, the start button 182 will receive the press signal generated by the user pressing the start button 182 and then will send the received press signal to the processor 15 via the headset jack.

Then the processor 15 will perform Step 201: Receiving a press signal, and recording the time at which the press signal is received.

After receiving the press signal of the start button 182, the processor 15 will record the time at which the press signal is received.

Then if the user releases the start button 182, the headset will perform Step 302: Receiving a release signal and sending the release signal.

When the user releases the start button 182, the start button 182 will receive the release signal generated by the user releasing the start button 182. The start button 182 will send the received release signal to the processor 15 via the headset jack.

Then the processor 15 will perform Step 202: Receiving a release signal, and recording the time at which the release signal is received.

After the processor 15 receives the release signal from the start button 182, it will record the time at which the release signal is received.

Then the processor 15 will perform Step 203: Calculating the difference between the time at which the release signal is received and the time at which the press signal is received, and regarding the difference as one of the start button pressing times.

The processor 15 calculates the difference between the time at which the release signal of the start button 182 is received and the time at which the press signal of the start button 182 is received and regards the difference in time as the pressing time P1 of the start button 182.

Then the processor 15 will perform Step 204: Detecting if a pressing time of the start button is less than a pressing threshold time, where the pressing threshold time is a duration within a range of 0.001 seconds to 1.5 seconds.

The processor 15 will detect if the pressing time P1 is less than a pressing threshold time PT1, where the pressing threshold time is a duration within a range of 0.001 seconds to 1.5 seconds. If the processor 15 detects that the pressing time P1 is less than a pressing threshold time PT1, the method proceeds to Step 205: Determining that the audio input mode is the short-press mode. Since Steps 204 and 205 are equivalent to Steps 101 and 102 in the first embodiment, Steps 204 and 205 will not be described in detail. In addition, since the headset 18 in the second embodiment is plugged into the headset jack of the electronic device 10a, then after the processor 15 determines in step 205 that the audio input mode to be used by the user is the short-press mode, the processor 15 can also send a prompt sound input signal to the headset 18, such that the headset 18 receives the prompt sound input signal and plays a prompt sound to prompt the user to start recording.

After Step 204, if the processor 15 detects that the pressing time P1 is not less than the pressing threshold time PT1, the method proceeds to Step 206: If not, sending a prompt sound input signal.

If the processor 15 detects that the pressing time P1 is not less than a pressing threshold time PT1, the processor 15 sends a prompt sound input signal to the headset 18. However, the processor 15 may also be designed to send the prompt sound input signal to the speaker 13.

Then the headset 18 will perform Step 303: Receiving a prompt sound input signal, and playing the prompt sound.

The headset 18 will receive the prompt sound input signal and play a prompt sound to prompt the user to start recording. When a user hears the prompt sound from the headset 18, the user can speak into the microphone 181 to start recording. However, if the processor 15 is designed to transmit the prompt sound input signal to the speaker 13, the speaker 13 will receive the prompt sound input signal and play the prompt sound.

When the user speaks into the microphone 181 for recording, the headset 18 will perform Step 304: Receiving audio and sending the audio.

The microphone 181 of the headset 18 will receive audio input by the user and send the audio to processor 15.

Then the processor will perform Step 207: Receiving audio and recording the time at which the audio is received.

The processor 15 receives the audio from the headset 18 and records the time at which the audio is received. The time at which the processor 15 records the audio is regarded as a start time for detecting the audio time V1.

When the user stops inputting audio to the microphone 181, the headset will perform Step 305: Stopping receiving audio, and sending an audio stop signal.

When the user stops inputting audio to the microphone 181, the microphone 181 will not receive any audio. At this time, the microphone 181 of the headset 18 will stop receiving the audio and send an audio stop signal to the processor 15.

Then the processor 15 will perform Step 208: Receiving an audio stop signal, and recording the time at which the audio stop signal is received.

The processor 15 receives the audio stop signal from the headset 18 and records the time at which the audio stop signal is received, and the time of the audio stop signal being received is regarded as an end time of detecting the audio time V1.

Then the processor 15 will perform Step 209: Calculating the difference between the time at which the audio is received and the time at which the audio stop signal is received, and the difference in time is treated as the audio time of the audio received by the microphone.

The processor 15 will calculate the difference between the time at which the audio is received and the time at which the audio stop signal is received, and the difference is time is treated as the audio time V1 of the audio received by the microphone 181.

Then the processor 15 will perform Step 210: Detecting if an audio time of the audio received by the microphone during the pressing time exceeds an audio threshold time, where the audio threshold time is 0 seconds to 1.5 seconds. Also, with the result of Step 210, selectively the method proceeds to Step 211: If so, determining that the audio input mode is the long-press mode; or the method proceeds to Step 212: If not, determining that the audio input mode is the short-press mode. In the first embodiment, since Step 210 is equivalent to Step 103, Step 211 is equivalent to Step 104, and Step 212 is equivalent to Step 102, Steps 210, 211, and 212 will not be described in detail herein.

The method of detecting audio inputting mode in the present invention can automatically detect if the audio inputting mode to be used by a user is a long pressing mode or a short pressing mode according to user's operating habit. This facilitates more natural and convenient use of electronic devices.

It should be noted that the described embodiments are only for illustrative and exemplary purposes, and that various changes and modifications may be made to the described embodiments without departing from the scope of the invention as disposed by the appended claims.

What is claimed is:

1. A method of detecting audio input mode applied to an electronic device, wherein the electronic device comprises a microphone and a start button, the microphone being used to receive an audio input, the start button being used for a user to press to enable an audio input mode for audio input, wherein the audio input mode is determined to be a short-press mode or a long-press mode according to the difference of how the user presses the start button, the method of detecting audio input mode comprising:
    detecting if a pressing time of the start button is less than a threshold time, where the pressing threshold time is a duration within a range of 0.001 seconds to 1.5 seconds;
    if so, determining that the audio input mode is the short-press mode and recording;
    if not, detecting if an audio time of the receiving audio of the microphone exceeds an audio threshold time during the pressing time, where the audio threshold time is 0 seconds to 1.5 seconds;
    if so, determining that the audio input mode is the long-press mode and recording; and
    if not, determining that the audio input mode is the short-press mode and recording.

2. The method of detecting audio input mode as claimed in claim 1, where the pressing threshold time is a duration within the range of 0.001 seconds to 0.8 seconds.

3. The method of detecting audio input mode as claimed in claim 2, wherein the audio threshold time is 0.2 seconds to 0.9 seconds.

4. The method of detecting audio input mode as claimed in claim 3, wherein detecting the audio time is started when the user presses the start button.

5. The method of detecting audio input mode as claimed in claim 4, wherein the electronic device is a mobile phone, a computer or a tablet computer.

6. The method of detecting audio input mode as claimed in claim 5, wherein the electronic device further includes a speaker which is used to issue a prompt sound; a start time for detecting the audio time is after the speaker plays the prompt sound.

7. The method of detecting audio input mode as claimed in claim 5, wherein the electronic device further includes a headset which is used to issue a prompt sound; a start time for detecting the audio time is after the headset plays the prompt sound.

8. The method of detecting audio input mode as claimed in claim 4, wherein the electronic device further includes a speaker which is used to issue a prompt sound; a start time for detecting the audio time is after the speaker plays the prompt sound.

9. The method of detecting audio input mode as claimed in claim 1, wherein the audio threshold time is 0.2 seconds to 0.9 seconds.

10. The method of detecting audio input mode as claimed in claim 1, wherein detecting the audio time is started when the user presses the start button.

11. The method of detecting audio input mode as claimed in claim 1, wherein when the audio input mode is the long-press mode, an end time of user input audio is the time at which the user releases the start button; when the audio input mode is the short-press mode, an end time of user input audio is not the time at which the user releases the start button.

* * * * *